(12) United States Patent
Rival et al.

(10) Patent No.: US 7,735,648 B2
(45) Date of Patent: Jun. 15, 2010

(54) TRANSPORT POD WITH PROTECTION BY THE THERMOPHORESIS EFFECT

(75) Inventors: Jean-Luc Rival, Villaz (FR); Hisanori Kambara, Villy-Le-Pelloux (FR); Roland Bernard, Viuz-La-Chiesaz (FR)

(73) Assignee: Alcatel, Paris (FR)

( * ) Notice: Subject to any disclaimer, the term of this patent is extended or adjusted under 35 U.S.C. 154(b) by 1117 days.

(21) Appl. No.: 11/109,783

(22) Filed: Apr. 20, 2005

(65) Prior Publication Data

US 2005/0236942 A1    Oct. 27, 2005

(30) Foreign Application Priority Data

Apr. 21, 2004   (FR) .................................... 04 50749

(51) Int. Cl.
*B65G 49/07* (2006.01)
(52) U.S. Cl. ........................ 206/454; 206/710; 414/935
(58) Field of Classification Search ................ 118/500, 118/715, 719; 414/217, 935; 156/345.1; 206/213.1, 454, 710, 711, 712
See application file for complete search history.

(56) References Cited

U.S. PATENT DOCUMENTS

| | | | |
|---|---|---|---|
| 5,143,103 A * | 9/1992 | Basso et al. ................. 134/98.1 |
| 5,255,783 A | 10/1993 | Goodman | |
| 5,472,550 A * | 12/1995 | Periasamy ............... 156/345.1 |
| 5,549,205 A | 8/1996 | Doche | |
| 6,214,425 B1 | 4/2001 | Scotto D'Apolinia et al. | |
| 6,253,464 B1 * | 7/2001 | Klebanoff et al. ............. 34/403 |
| 6,422,823 B2 | 7/2002 | Bernard | |
| 6,533,534 B2 * | 3/2003 | Schmitt et al. ................. 216/67 |
| 7,159,719 B2 * | 1/2007 | Golda ...................... 206/524.4 |
| 2002/0124906 A1 | 9/2002 | Kishi et al. | |
| 2006/0073395 A1 * | 4/2006 | Phillips ......................... 430/5 |

FOREIGN PATENT DOCUMENTS

| | | |
|---|---|---|
| EP | 0 617 573 A | 9/1994 |
| EP | 0 692 816 A | 1/1996 |
| EP | 0 791 952 A | 8/1997 |
| EP | 1 107 292 A | 6/2001 |
| JP | 09 027542 A | 5/1997 |
| WO | WO 97/13947 A | 4/1997 |

OTHER PUBLICATIONS

Filed Apr. 20, 2005, entitled "Apparatus for Transporting Substrates Under a Controlled Atmosphere" by Roland Bernard.
U.S. Appl. No. 11/109,853 filed Apr. 20, 2005, entitled "Apparatus for Transporting Substrates Under a Controlled Atmosphere" by Roland Bernard et al.

* cited by examiner

*Primary Examiner*—Jacob K Ackun, Jr.
(74) *Attorney, Agent, or Firm*—Sughrue Mion, PLLC

(57) ABSTRACT

A transport pod (1) of the invention for a mask or a semiconductor wafer (2) comprises a leakproof peripheral wall (3) surrounding an inside space (4) receiving the mask or the semiconductor wafer (2). Thermally conductive support means (11) hold the mask or the semiconductor wafer (2). A cold plate (7) thermally coupled to a cold source (8) generates a temperature gradient facing the main face (6) of the mask or the semiconductor wafer (2) that is to be protected against particulate pollution. The cold plate (7) is held by connection means (7b) including thermal insulation means (7c). An onboard energy source (9) powers the cold source (8). This significantly reduces deposition of polluting particles on the main face (6) of the mask or the semiconductor wafer (2).

20 Claims, 2 Drawing Sheets

TRANSPORT POD WITH PROTECTION BY THE THERMOPHORESIS EFFECT

CROSS-REFERENCE TO RELATED APPLICATIONS

This application is based on and claims the benefit of French patent application No. 04/50 749, filed Apr. 21, 2004, which is incorporated herein by reference.

FIELD OF THE INVENTION

The present invention relates to conserving and moving semiconductor substrates or masks in cleanrooms between the various working steps to which semiconductor substrates or masks are subjected in processes for fabricating semiconductors and microelectronic mechanical systems (MEMS).

BACKGROUND

In the fabrication of semiconductors and MEMS, wafers such as silicon wafers or masks are transported in transport pods or mini-environment enclosures that protect them from the pollution that is still present in the atmosphere of a cleanroom.

At present, stacks of silicon wafers having a diameter of 200 millimeters (mm) are transported in standard mechanical interface (SMIF) pods.

Stacks of silicon wafers having a diameter of 300 mm are transported in standardized front-opening universal pods (FOUPs).

Transport pods or mini-environment enclosures have also been devised that are adapted to transporting a single substrate wafer.

Semiconductor or other wafers typically remain for several weeks in a semiconductor fabrication unit between the various process steps. Throughout this time, semiconductor or other wafers need to be protected against any risk of pollution, which is why provision is made form them to be isolated from the atmosphere within cleanrooms, wafers being transported and conserved in mini-environment enclosures.

In present industrial applications, the atmosphere in a mini-environment enclosure is at atmospheric pressure. Such enclosures therefore do not require any energy source.

More recently, in order to improve the isolation and protection of wafers, proposals have been made to generate and maintain an inside atmosphere at low pressure. Unfortunately, a mini-environment enclosure needs to be disconnected during steps of being moved between different workstations. During such a disconnection period, the mini-environment enclosure must itself maintain the controlled atmosphere around the substrate it contains. That requires an energy source to be available in the mini-environment enclosure, together with a pumping system for maintaining the controlled atmosphere which is at very low pressure, i.e. at a pressure of the same order as the pressures that exist in the transfer and loading chambers leading to process chambers.

Whether or not they have means for generating and maintaining an inside atmosphere at low pressure, transport pods must necessarily be opened when inserting masks or semiconductor wafers, and also when extracting them. During open periods, polluting particles can penetrate into a transport pod, thereby degrading the quality of the atmosphere inside the transport pod. Such particles run the risk subsequently of becoming deposited on masks or semiconductor wafers contained in the transport pod.

Such pollution is harmful in the semiconductor industry since it leads to defects that spoil the quality of the microelectronic or micromechanical device being fabricated.

There is therefore a need to reduce the pollution of semiconductor wafers or masks while they remain within transport pods.

SUMMARY OF ASPECTS OF THE INVENTION

The problem addressed by the present invention is thus to improve the elimination of polluting particles, avoiding them being deposited on the active face of the mask or semiconductor wafer while it remains in the transport pod.

For this purpose, the essential idea of the invention is to provide the transport pod with means tending to move polluting particles away from the active face of a mask or a semiconductor wafer contained in the enclosure.

Such means for moving polluting particles may advantageously be a cold plate, having an active face placed close to the main face for protection of the mask or the semiconductor wafer. A temperature gradient is thus established between the cold plate and the main face that is to be protected, providing the cold face is at a temperature lower than that of the main face that is to be protected. The effect of the temperature gradient is to cause any polluting particles that might be present in the space between the cold plate and the main face that is to be protected to be moved progressively away from the main face that is to be protected towards the cold plate. This results in a lower probability of a polluting particle being deposited on the main face that is to be protected of the mask or the semiconductor wafer.

Polluting particles are moved by the thermophoresis effect: the hotter surrounding gas molecules situated between a polluting particle under consideration and the main face that is to be protected generate thrust on the particle that is greater than the thrust generated by the cooler surrounding gas molecules situated between the particle and the cold plate; the difference between the thrusts causes the particle to move towards the cold plate.

The invention provides means for implementing this thermophoresis effect in a transport pod adapted for transporting masks or semiconductor wafers during the intermediate steps between process steps in which the masks or the semiconductor wafer is processed.

Thus, the invention provides a transport pod for a mask or a semiconductor wafer, the pod comprising a leakproof peripheral wall surrounding an inside space shaped to receive and contain a mask or a semiconductor wafer that is to be transported, the wall having a port for inserting or extracting the mask or the wafer, and having support means for holding the mask or the semiconductor wafer in a fixed position relative to the leakproof peripheral wall, the mask or the semiconductor wafer having a main face that is to be protected against particulate pollution; the transport pod comprises:

a cold plate of thermally conductive material placed in the inside space;

a cold source thermally coupled to the cold plate by thermal coupling means and adapted to maintain the cold plate at a temperature lower than the ambient temperature in the transport pod;

connection means for holding the cold plate in position relative to the leakproof peripheral wall;

thermal insulation means provided in the connection means and adapted to insulate the cold plate thermally relative to the leakproof peripheral wall;

an on-board energy source powering the cold source; and the cold plate having an active face positioned facing the main face that is to be protected and in the vicinity thereof.

This disposition makes it possible to benefit from the thermophoresis effect in order to reduce pollution of the main face that is to be protected, while remaining compatible with the other functions of the transport pod, and in particular the need to hold the masks or the semiconductor wafer in satisfactory manner in the transport pod, the need for the mask or the semiconductor wafer to be easily moved for insertion into the transport pod or for extraction from the transport pod, and the need for the transport pod to be disconnectable so as to allow it to be used as means for transporting and storing masks or semiconductor wafers in semiconductor fabrication installations.

In a preferred embodiment, the active face of the cold plate is plane and of dimensions greater than those of the main face that is to be protected.

Also in preferred manner, the active face of the cold plate is substantially parallel to the main face that is to be protected. This ensures that the thermophoresis effect is distributed uniformly over the entire main face that is to be protected.

The thermophoresis effect is effective when the temperature gradient between the cold plate and the main face that is to be protected is sufficiently steep. For this purpose, a first means is constituted by the cold source and the thermal coupling means for cooling the cold plate together with the thermal insulation means that thermally insulate the cold plate relative to the leakproof peripheral wall, so as to avoid cooling said leakproof peripheral wall. Another means is to avoid cooling the mask or the semiconductor wafer while it remains in the transport pod by providing for the support means to conduct heat, thus maintaining the mask or the semiconductor wafer at ambient temperature, i.e. at the temperature of the leakproof peripheral wall.

Good results are obtained by making provision for the cold source to maintain a temperature gradient of 3° C. to 10° C. approximately between the cold plate and the main face that is to be protected.

The active face of the cold plate may advantageously be at a small determined distance from the main face that is to be protected. This determined distance may advantageously be less than 1 centimeter (cm), and more advantageously it may be equal to about 5 mm.

Because it attracts polluting particles, the cold plate becomes progressively coated in polluting particles. There is therefore a risk of certain polluting particles subsequently becoming detached from the cold plate and dropping onto the main face that is to be protected. It is therefore useful to clean the cold plate periodically. For this purpose, provision is made for the cold plate to be removable, such that it can be cleaned periodically away from the transport pod.

In principle, so long as the cold plate is at a temperature that is low enough, it can be expected that the particles that have been attracted by the cold plate will remain on or in the immediate vicinity of the cold plate for a sufficient length of time, i.e. for the time during which the semiconductor wafer or the mask is being stored and transported.

However there remains a risk that particles become detached from the cold plate. When the particles come into contact with the cold plate they can bounce, slide tangentially, or adhere to the cold plate. It would therefore appear advantageous to ensure that particles adhere to the cold plate for a sufficient length of time, i.e. until a subsequent cleaning operation.

The ability of particles to adhere to the cold plate depends on several physical parameters. In particular, this ability can depend on the material from which the cold plate is made, on its surface state, and on its temperature.

In the invention, it is therefore advantageous to ensure that the active face of the cold plate is of a structure that gives it particle-trapping properties so as to retain incident particles, i.e. particles that come close enough to the cold plate or that come into contact therewith.

In a first embodiment, the cold plate may be made of a material that itself possesses particle-trapping properties due to incident particles adhering thereto.

In another embodiment, which can be used as an alternative or in addition, the active face of the cold plate may be subjected to appropriate surface treatment giving it particle-trapping properties. By way of example, the treatment may increase the roughness of its surface. Nevertheless, it should be observed that surface roughness can also increase the undesirable phenomenon of degassing into a vacuum environment.

As an alternative or in addition, the active face of the cold plate may be constituted by the outside face of a thin surface layer of a suitable material applied to the cold plate. For example, an appropriate thin layer of metal might be deposited.

Possible pollution of masks or semiconductor wafers in the transport pod can also be reduced by further providing pump means to generate and maintain a vacuum lying in the range 50 pascals (Pa) to 1000 Pa in the transport pod.

To solve the problem of mini-environment enclosures being capable of maintaining a vacuum while disconnected and also being small in size, it is appropriate to use an on-board pumping system in the mini-environment enclosure together with an on-board energy source. Since the mini-environment enclosure is leakproof, pumping capacity can be small, being just sufficient to maintain the appropriate vacuum throughout the desired duration of disconnection. It is thus possible to envisage using pump means comprising a micropump having a plurality of individual thermal transpiration cells which operate in satisfactory manner so long as the gas pressure is low. Such a micropump can be associated with a primary pump connected in series with the outlet from the micropump and itself delivering to the atmosphere. That requires an energy source of sufficient capacity to power not only the micropump but also the primary pump.

Such a micropump may advantageously comprise a plurality of individual thermal transpiration pumping cells. Such thermal transpiration pumping cells use the thermal transpiration effect described by Knudsen in the 1900s, whereby, when two successive volumes are connected by a channel of transverse dimensions that are very small, of radius shorter than the length of the mean free path of the gas molecules present, and when the ends of the channel are at different temperatures, a pressure difference becomes established between the two successive volumes. In the small-sized channel, molecules move under molecular conditions, and as a result different pressures are obtained at the two ends of the channel due to the temperature difference. Under molecular conditions, when thermal equilibrium is reached, the pressures at the two ends of the channel are such that their ratio is equal to the square root of the ratio of the corresponding temperatures. When the molecules reach the volume adjacent to the end of the channel, their movement is then subjected to viscous medium conditions and they no longer return into the channel. This produces a pumping effect.

The compression ratio of an individual cell is small, but it is possible to increase the number of cells connected in series and/or in parallel for gas flow purposes so as to reach a compression ratio and a pumping capacity that are appropriate.

Such a mini-environment enclosure is thus suitable for presenting satisfactory endurance while disconnected, due to the low energy consumption by the micropump.

Under such circumstances, the cold source may advantageously comprise one or more Peltier element cold sources with corresponding hot sources constituting the heater elements for the individual thermal transpiration pumping cells that form the pump means for generating and maintaining a suitable vacuum in the pod.

This saves a certain amount of energy since the electrical energy delivered by the on-board energy source in the transport pod is transformed entirely into cooling energy for the cold plate and heating energy for the micropump.

In addition or as an alternative, an adsorbent element can be placed in contact with the atmosphere in the cavity inside the mini-environment enclosure. The adsorbent element then makes it possible to adsorb gas molecules, thereby contributing to maintaining the vacuum in the inside cavity, in addition to the micropump or instead of the micropump.

BRIEF DESCRIPTION OF THE DRAWINGS

Other objects, characteristics, and advantages of the present invention appear from the following description of particular embodiments, given with reference to the accompanying figures, in which.

DESCRIPTION OF EXEMPLARY
NON-LIMITING EMBODIMENTS OF THE
INVENTION

Figure 1:
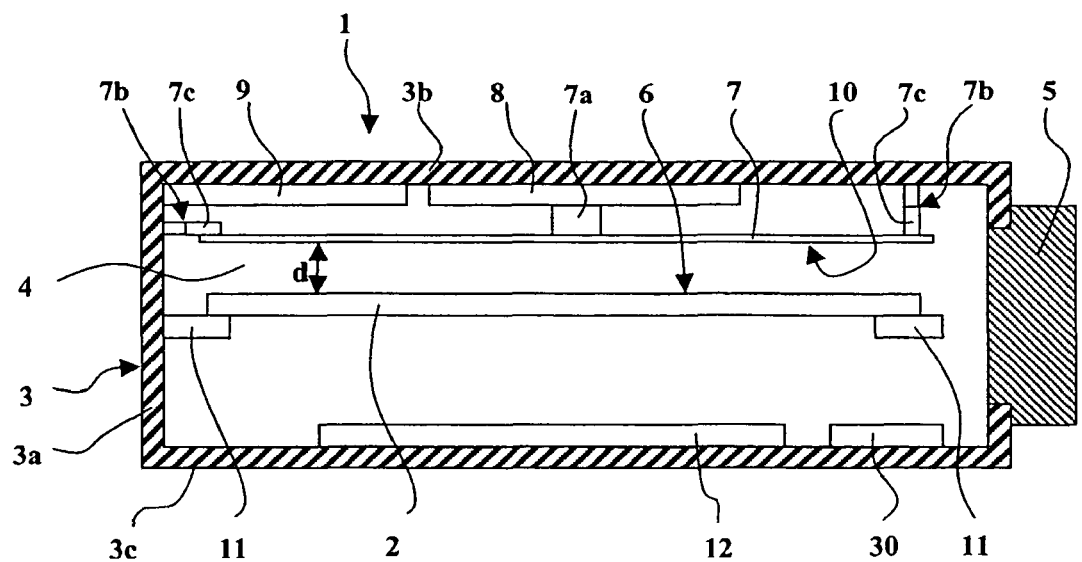
FIG. 1 is a diagrammatic side view in section of a transport pod constituting an embodiment of the invention, containing a mask or semiconductor wafer with the main face that is to be protected facing upwards.

In the embodiment shown in FIG. 1, a transport pod 1 of the invention has an inside cavity 4 shaped to receive and contain a wafer 2 such as a semiconductor wafer or a mask, of the kind used in the semiconductor industry.

The dimensions of the inside cavity 4 are selected as a function of the size of the wafer 2 to be contained, preferably making provision for the dimensions of the inside cavity 4 to be only slightly greater than the dimensions of the wafer 2 so as to ensure that the atmosphere around the wafer 2 is of relatively small volume and thus easier to maintain in a satisfactory state during a long period of disconnection.

The inside cavity 4 advantageously presents a shape having a cylindrical portion that is adapted to contain a semiconductor wafer 2 of disk shape.

The inside cavity 4 is surrounded by a leakproof peripheral wall 3 comprising a peripheral portion 3a, a first main portion 3b, and a second main portion 3c.

The peripheral portion 3a of the leakproof peripheral wall 3 includes a closable side opening structure 5 enabling the mask or the wafer 2 to be inserted or extracted. The closable side opening structure 5 is shaped in known manner to co-operate with external automatic opening and closing means and with means for handling the mask or the semiconductor wafer 2 for insertion or extraction thereof.

In principle, the mask or the semiconductor wafer 2 presents a main face 6 that needs to be protected more particularly against particulate pollution. This is the face where patterns are etched to define the shape of semiconductor components.

The mask or the semiconductor wafer 2 is held in a fixed position in the inside space 4 by support means 11, e.g. conventional support means of the kind generally used in transport pods for masks or semiconductor wafers, and that are shown in the figures in diagrammatic form only. Thus, the support means 11 are interposed between the leakproof peripheral wall 3 and the mask or the semiconductor wafer 2. As support means 11, it may be preferred to use an electrostatic clamping device.

The support means 11 preferably conduct heat so as to maintain the mask or the semiconductor wafer 2 at ambient temperature or at the temperature of the leakproof peripheral wall 3.

A cold plate 7 of heat-conductive material is placed in the inside space 4 facing the main face 6 that is to be protected.

The cold plate 7 is held by connection means 7b in a fixed position in the inside space 4, the connection means 7b mechanically connecting the cold plate 7 to the leakproof peripheral wall 3. Thermal insulation means 7c are provided in the connection means 7b and are adapted to insulate the cold plate 7 thermally relative to the leakproof peripheral wall 3.

A cold source 8, shown diagrammatically, is thermally coupled to the cold plate 7 by thermal coupling means 7a. The cold source 8 keeps the cold plate 7 at a temperature that is lower than the ambient temperature in the transport pod 1.

An on-board energy source 9 powers the cold source 8 so as to give it the energy needed to lower temperature.

The cold plate 7 has an active face 10 placed facing and close to the main face 6 that is to be protected. As a result, a temperature gradient is established between the cold plate 7 and the mask or the semiconductor wafer 2. This gradient may advantageously be approximately 3° C. to 10° C.

The active face 10 of the cold plate 7 may advantageously be plane and of dimensions greater than those of the main face 6 that is to be protected. Similarly, the active face 10 in the embodiment shown in the figures is substantially parallel to the main face 6 that is to be protected.

Finally, the active face 10 of the cold plate 7 is at a determined distance d from the main face 6 that is to be protected. This determined distance d must be small, preferably less than 1 cm. Good results can be obtained by using a determined distance d equal to about 5 mm.

The cold plate 7 may be of any material having high thermal conductivity. For example, it is possible to use silicon or aluminum. Metals could also be selected that have good properties in a vacuum, in particular metals that present little propensity to degassing, and that present an ability to reduce any risk of electric fields appearing, since such fields would subsequently be liable to cause undesirable movements of certain polluting particles.

By means of the thermophoresis effect, the temperature gradient between the cold plate 7 and the mask or the semiconductor wafer 2 which is at a temperature higher than that of the cold plate 7 induces a thrust force on particles, urging them towards the cold plate 7, i.e. away from the mask or the semiconductor wafer 2. This thrust force can overcome various forces that might urge polluting particles to move towards the mask or the semiconductor wafer 2, e.g. electrostatic forces, the force of gravity, and Brownian motion. Thermophoresis forces cause particles to move towards lower temperature regions.

The thermophoresis effect decreases with decreasing gas pressure in the inside space 4. Nevertheless, experience shows that the thermophoresis effect is still very effective in the pressure ranges that are generally used in pods for transporting masks or semiconductor wafers. It is thus considered that with a temperature difference of about 10° C. over a distance d of about 1 cm, and for a gas pressure of about 5 Pa, a reduction is obtained in the deposition of particles on the main face 6 that is to be protected by a factor of about $10^6$ for particles having a diameter greater than 0.03 micrometers (μm).

Preferably, the cold plate 7 is mounted removably in the transport pod so that it can be withdrawn temporarily from the transport pod or changed for another cold plate. It should be possible to withdraw the cold plate through the closable side opening structure 5. This enables the cold plate 7 to be regenerated or cleaned periodically away from the transport pod 1, e.g. by being swept with nitrogen and/or by being heated.

In the embodiment shown in FIG. 1, the main face 6 that is to be protected faces upwards. Under such circumstances, the cold plate 7 forms the ceiling of the inside space 4. It will be understood that this disposition can encourage certain polluting particles to be deposited since they move under gravity towards the main face 6 that is to be protected. Nevertheless, the action of gravity is limited.

Figure 2:
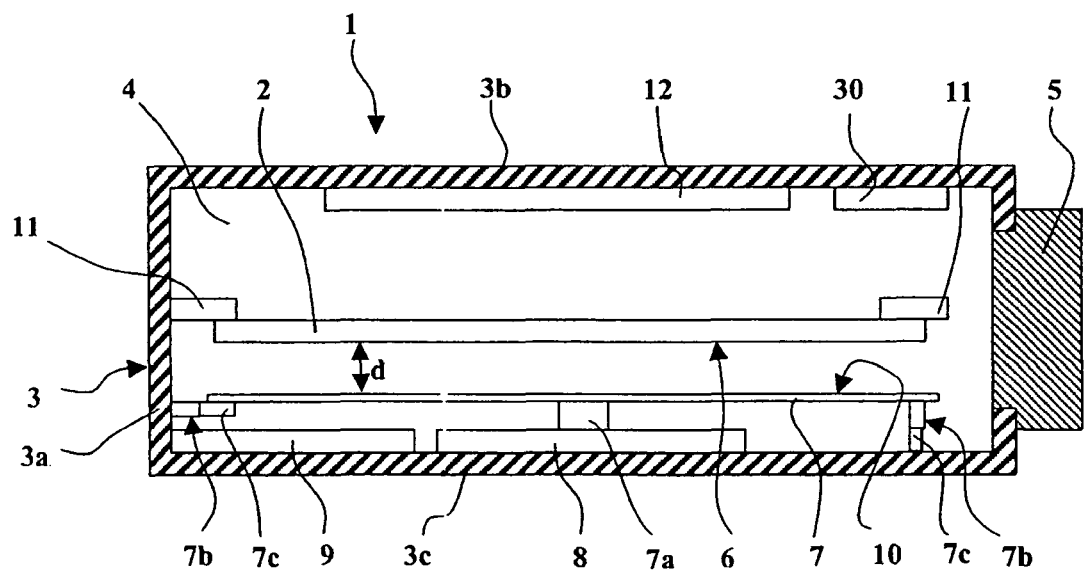
FIG. 2 shows a variant of the FIG. 1 transport pod containing a mask or semiconductor wafer with the main face that is to be protected facing downwards.

In the second embodiment, shown in FIG. 2, the main face 6 that is to be protected against particulate pollution faces downwards. The cold plate 7 then forms the floor of the inside face 4. It will be understood that this disposition is more favorable in that natural gravity acts as additional means tending to reduce the possibility of polluting particles becoming deposited on the main face 6 that is to be protected.

In the embodiments shown in the figures, pump means 12 are also provided for generating and maintaining a suitable vacuum in the transport pod 1, e.g. a vacuum of about 50 Pa to 1000 Pa.

The pump means 12 may advantageously comprise a thermal transpiration micropump constituted by a plurality of individual pumping cells, some of which are connected in series, with a plurality of series-connected subassemblies being connected in parallel so as to obtain the flow rate and compression ratio properties that are desired for the intended application.

Individual thermal transpiration pumping cells have respective hot sources that can be constituted by electrical resistances, suitable for being electrically powered to produce the compression effect. An energy supply such as electrical energy storage means are then provided, e.g. a rechargeable battery. The energy supply may be constituted by the above-mentioned on-board energy supply 9 or by a separate energy supply.

Alternatively, or in addition, the pump means 12 may comprise an adsorbent element 30 suitable for adsorbing gas molecules and thus contributing to maintaining a low pressure in the inside space 4.

Zeolites constitute an example of a material suitable for making the adsorbent element 30. Zeolites are crystallized alkaline silico-aluminates of stable structure possessing microporosity that is regular and large, in which cations are as mobile as they are in a liquid. This results in a capacity for exchange, adsorption, and catalysis. Zeolites constitute solid structures defining large internal cavities in which molecules can be adsorbed. These cavities are interconnected by pore openings through which molecules can pass. Because of the crystalline nature, the pores and the cavities are of sizes that are regular and very similar, and as a function of the size of such openings, the structure can adsorb certain molecules corresponding to the size of the openings, while other molecules of larger size are rejected. Appropriate zeolites are therefore selected as a function of the size of the gas molecules that are to be adsorbed.

Alternatively, the adsorbent element may be constituted by any other material of the kind conventionally used for making getter pumps.

Figure 3:
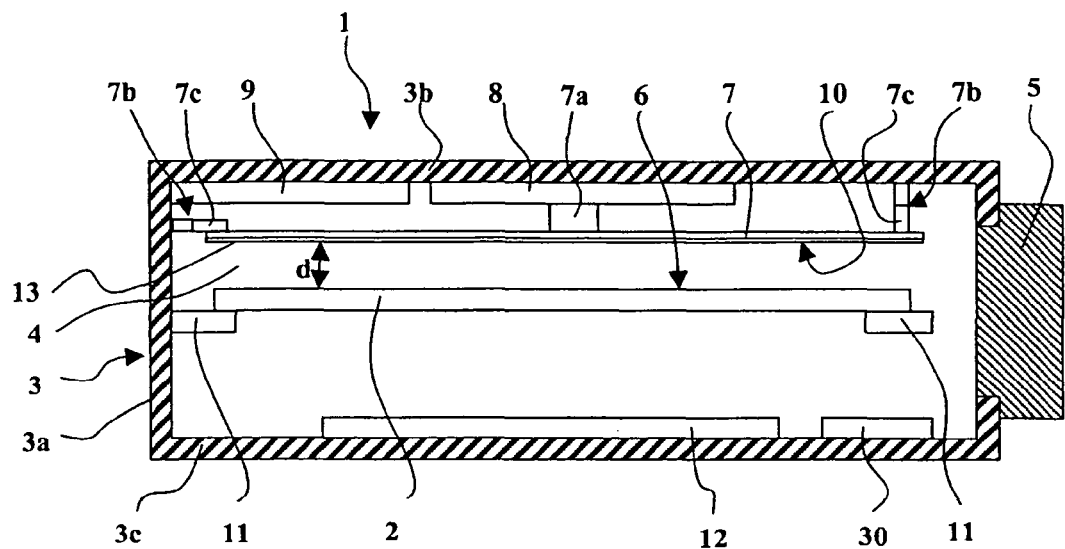
FIG. 3 shows another embodiment of the FIG. 1 transport pod including a surface layer.
Figure 4:
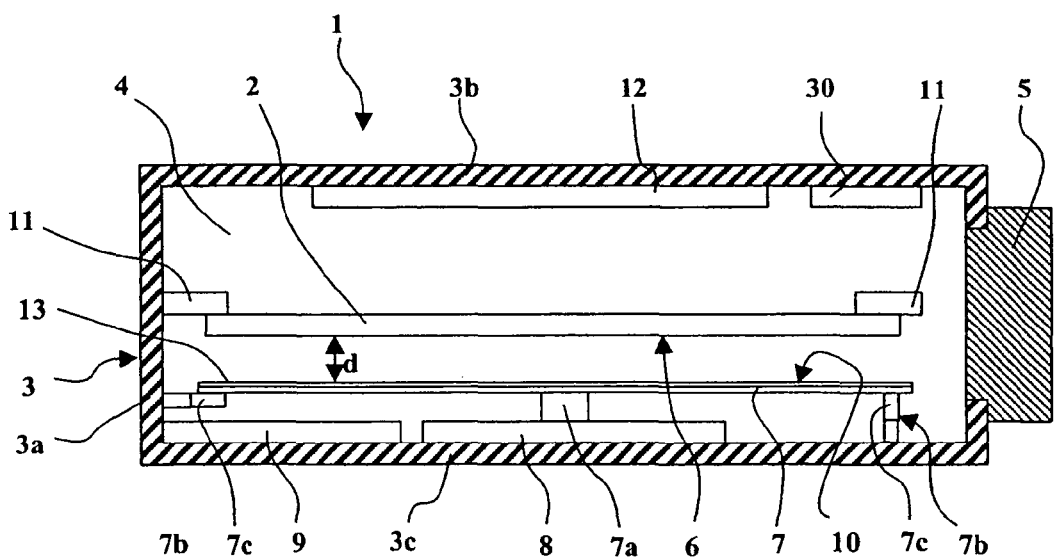
FIG. 4 shows a variant of the FIG. 3 transport pod, with the main face that is to be protected facing downwards.

The embodiments of FIGS. 3 and 4 reproduce most of the same essential means as the embodiments of FIGS. 1 and 2. These essential means are identified by the same numerical references and are therefore not described again.

The embodiments of FIGS. 3 and 4 differ in that particle-trapping means 13 are also provided on the active face 10 of the cold plate 7.

The particle-trapping means serve to retain incident particles that have previously been moved so as to come into contact with the cold plate or into its immediate vicinity.

In a first possibility, the cold plate may be made of a material that itself presents particle-trapping properties due to incident particles adhering thereto. Materials such as aluminum, copper, and silicon present good properties in this respect.

In a second possibility; that can be used alternatively or in addition, the cold plate may receive surface treatment on its active face suitable for giving it improved particle-trapping properties. For example, surface roughness may be increased by such surface treatment, thereby increasing the capacity of the surface to retain particles. Nevertheless, it is important to avoid excessively increasing the degassing phenomena that are usually presented by rough surfaces. It may therefore be preferable to use other types of surface treatment that are compatible with a low-pressure atmosphere.

In another possibility, the active face of the cold plate may be the outside face of a thin surface layer of a suitable material applied to the cold plate. The surface layer may be applied by any means, e.g. by adhesive or by soldering. The thin layer may be metal plating, which is compatible with a low pressure atmosphere.

Materials that are suitable for implementing particle-trapping properties by incident particles adhering thereto can advantageously be selected from materials presenting a high degree of electron activity. Copper, aluminum, and silicon present such properties. In applications of treating silicon wafers for fabricating electronic components, a silicon active surface can present the advantage of avoiding any risk of contamination by supplying a material that is foreign to the material of the wafer that is to be treated.

The particles that are pushed by the thermophoresis effect towards the cold plate 7 come into contact with and adhere to the layer 13. This avoids subsequent movement of those particles.

The surface layer 13 is thin so as to avoid harming the thermophoresis effect.

In all of the embodiments of the invention shown in FIGS. 1 to 4, it will be understood that the above-described means serve simultaneously to improve protection of the main face 6 that is to be protected against particulate pollution, and to guarantee satisfactory endurance for the transport pod while it is disconnected, because of the low energy expenditure for powering the thermophoresis means and the pumping means.

The present invention is not restricted to the embodiments described explicitly above, but includes the diverse variants and generalizations that come within the competence of the person skilled in the art.

What is claimed is:

1. A transport pod (1) for a mask or a semiconductor wafer (2), the pod comprising a leakproof peripheral wall (3) surrounding an inside space (4) shaped to receive and contain a mask or a semiconductor wafer (2) that is to be transported, the wall having a port (5) for inserting or extracting the mask or the wafer (2), and having support means (11) for holding the mask or the semiconductor wafer (2) in a fixed position relative to the leakproof peripheral wall (3), the mask or the semiconductor wafer (2) having a main face (6) that is to be protected against particulate pollution, the transport pod (1) being characterized in that it comprises:
   a cold plate (7) of thermally conductive material placed in the inside space (4);
   a cold source (8) thermally coupled to the cold plate (7) by thermal coupling means (7a) and adapted to maintain the cold plate (7) at a temperature lower than the ambient temperature in the transport pod (1);
   connection means (7b) for holding the cold plate (7) in position relative to the leakproof peripheral wall (3);
   thermal insulation means (7c) provided in the connection means (7b) and adapted to insulate the cold plate (7) thermally relative to the leakproof peripheral wall (3);
   an on-board energy source (9) powering the cold source (8); and
   the cold plate (7) having an active face (10) positioned facing the main face (6) that is to be protected and in the vicinity thereof.

2. A transport pod according to claim 1, characterized in that the active face (10) of the cold plate (7) is plane and of dimensions greater than the dimensions of the main face (6) that is to be protected.

3. A transport pod according to claim 2, characterized in that the active face (10) of the cold plate (7) is substantially parallel to the main face (6) that is to be protected.

4. A transport pod according to claim 1, characterized in that the active face (10) of the cold plate (7) is at a determined small distance (d) from the main face (6) that is to be protected, said determined distance (d) being less than 1 cm, and advantageously being equal to about 5 mm.

5. A transport pod according to claim 1, characterized in that the support means (11) are thermally conductive for maintaining the mask or the semiconductor wafer (2) at ambient temperature.

6. A transport pod according to claim 1, characterized in that the cold source (8) maintains a temperature gradient of about 3° C. to 10° C. between the cold plate (7) and the main face (6) that is to be protected.

7. A transport pod according to claim 1, characterized in that the cold plate (7) is movable to enable it to be cleaned periodically away from the transport pod (1).

8. A transport pod according to claim 1, characterized in that it includes pump means (12) for generating and maintaining a vacuum of about 50 Pa to 1000 Pa inside the transport pod (1).

9. A transport pod according to claim 8, characterized in that the pump means (12) comprise a plurality of individual thermal transpiration pumping cells.

10. A transport pod according to claim 1, characterized in that the cold source (8) comprises one or more Peltier element cold sources.

11. A transport pod according to claim 1, characterized in that particle-trapping means (13) are provided on the active face (10) of the cold plate (7).

12. A transport pod according to claim 11, characterized in that the cold plate (7) is made of a material that itself presents particle-trapping properties by incident particles adhering thereto.

13. A transport pod according to claim 11, characterized in that the active face (10) of the cold plate (7) has received surface treatment suitable for giving it particle-trapping properties.

14. A transport pod according to claim 11, characterized in that the active face (10) of the cold plate (7) is the outside face of a thin surface layer (13) of a suitable material applied to the cold plate (7).

15. A transport pod for a mask or a semiconductor wafer, the pod comprising:
   a peripheral wall surrounding an inside space configured to contain a mask or a semiconductor device for transportation, the wall comprising a port though which the mask or semiconductor device is inserted or extracted,
   a support on which the a mask or a semiconductor device is held in the inside space;
   a cold plate of thermally conductive material in the inside space;
   a cold source thermally coupled to the cold plate, maintaining the cold plate at a temperature lower than an ambient temperature in the transport pod; and
   an on-board energy source powering the cold source; and
   wherein the cold plate comprises an active face positioned to face a main face of the mask or a semiconductor device that is to be protected from pollutants.

16. The transport pod according to claim 15, wherein the inside space is made leakproof by the peripheral wall.

17. The transport pod according to claim 15, wherein the cold plate is held in a fixed position relative to the peripheral wall.

18. The transport pod according to claim 15, further comprising thermal insulation that thermally insulates the cold plate from the peripheral wall.

19. A transport pod for a mask or a semiconductor wafer, the pod comprising:
   a peripheral wall surrounding an inside space configured to contain a mask or a semiconductor device for transportation, the wall comprising a port though which the mask or semiconductor device is inserted or extracted,
   a support on which the a mask or a semiconductor device is held in the inside space;
   a cold plate in the inside space; and
   means for maintaining the cold plate at a temperature lower than an ambient temperature in the transport pod and for maintaining a temperature gradient between a the cold plate and main face of the mask or a semiconductor device to be protected from pollutants.

20. A transport pod for a mask or a semiconductor wafer, the pod comprising:
   a peripheral wall surrounding an inside space configured to contain a mask or a semiconductor device for transportation, the wall comprising a port though which the mask or semiconductor device is inserted or extracted,
   a support on which the a mask or a semiconductor device is held in the inside space;
   means for moving particles away from a main face of the mask or a semiconductor device by thermophoresis effect.

* * * * *